United States Patent [19]

Okauchi et al.

[11] Patent Number: 5,036,419
[45] Date of Patent: Jul. 30, 1991

[54] ELECTRO-MECHANICAL TRANSDUCING ELEMENT AND A MOVING DEVICE USING THE SAME

[75] Inventors: Shigeki Okauchi, Tokyo; Masaya Maeda, Kanagawa, both of Japan

[73] Assignee: Canon Kabushiki Kaisha, Tokyo, Japan

[21] Appl. No.: 75,202

[22] Filed: Jul. 15, 1987

Related U.S. Application Data

[63] Continuation of Ser. No. 628,457, Jul. 6, 1984, abandoned.

[30] Foreign Application Priority Data

Jul. 12, 1983 [JP] Japan ................................ 58-126334

[51] Int. Cl.$^5$ ......................... G11B 5/58; G11B 7/09; G11B 21/10
[52] U.S. Cl. ................................. 360/109; 369/220
[58] Field of Search ............... 360/77, 106, 107, 109, 360/114; 369/DIG. 1, 122, 220

[56] References Cited

U.S. PATENT DOCUMENTS

| | | | |
|---|---|---|---|
| 3,349,174 | 2/1964 | Warschauer | 369/122 |
| 3,911,483 | 10/1975 | Kihara et al. | 360/77 |
| 4,099,211 | 7/1978 | Hathaway | 360/109 |
| 4,151,569 | 4/1979 | Hathaway | 360/77 |
| 4,268,880 | 5/1981 | Majima | 360/109 |
| 4,326,228 | 4/1982 | Sakamoto | 360/109 |
| 4,432,027 | 2/1984 | Higuchi | 360/103 |

Primary Examiner—Robert S. Tupper
Attorney, Agent, or Firm—Toren, McGeady & Associates

[57] ABSTRACT

The disclosed electro-mechanical transducing element has an elongated shape and is mechanically deformable in response to a supplied electrical signal. One or more electrically conductive portions are formed to run along the direction of elongation to form one or more electrical paths for one or more electrical members which are to be affixed to a portion or portions near the free end of the elongated element. According to a disclosed embodiment the electrical member or members are mechanically moved through mechanical deformation of the element. Electrical lead wires are connected to the electrically conductive portions at the first end of the element opposite the free end, thereby eliminating the influence of the lead wires on the deformation performance of the element.

20 Claims, 2 Drawing Sheets

ELECTRO-MECHANICAL TRANSDUCING ELEMENT AND A MOVING DEVICE USING THE SAME

This is a continuation of application Ser. No. 628,457, filed Jul. 6, 1984, now abandoned.

BACKGROUND OF THE INVENTION

1. Field of the Invention

The present invention relates to an electro-mechanical transducing element, and more particularly to an electro-mechanical transducing element which is mechanically deformable in response to an electrical signal, and to a mechanically moving portion in which the element is used.

2. Description of the Prior Art

Using the piezoelectric effect of a piezoelectric ceramic plate is well known.

A piezoelectric ceramic plate is formed of a polycrystalline material having a high dielectric coefficient. The piezoelectric property of the plate is polarized in a predetermined direction and exhibits a unique mechanical property when a voltage is applied to the plate. For example, when a voltage is applied to a thin and long piezoelectric ceramic plate provided on a substrate of metal or the like in the same direction as that of the polarization, the piezoelectric ceramic plate shrinks in the lengthwise direction, while the substrate does not change. Accordingly, piezoelectric ceramic plate deflects together with the substrate and the shift is produced by the mechanical deformation. To increase deflection, two piezoelectric ceramic plates can be combined. A voltage is applied to one plate in the direction of polarization and to the other plate in the reverse direction to that of polarization. A electro-mechanical transducing element including a pair of piezoelectric ceramic plates combined as mentioned above is known as a bimorph element. Such a bimorph element has a greater deflection than the electro-mechanical transducing element with a single piezoelectrical ceramic plate. A so-called push-pull effect is realized. Furthermore, it is possible to reverse the direction of deflection by reversing the polarity of the applied voltage.

U.S. Pat. No. 4,151,569 to Hathaway discloses an example of the application of such an electro-mechanical transducing element and, more particularly, a bimorph element to an apparatus requiring a large degree of deflection in both directions, such as a video tape recorder, a video disc recorder or the like. To effect proper reproduction of information recorded on a recording track of a tape or disc, it is necessary to position a reproducing head correctly on the track to be read out. It is then possible to use a bimorph element to adjust the head position for aligning the head with the recording track to be read out on the recording medium.

In a head moving device using a bimorph element such as disclosed in U.S. Pat. No. 4,151,569, the bimorph element is supported at one end, while its free end is fixed directly or via a printed circuit plate to the head. Signal wires are then connected to a coil of the head either directly or via the printed circuit plate. However, the fact that the lead wires are connected near the free end of the bimorph element, where the maximum shift is obtainable, causes an increase of the load on the bimorph element, because the lead wires themselves have a certain rigidity. Accordingly, this has a bad influence on positional control for the head by the bimorph element. For example, a desired shift of the head cannot be obtained or a larger drive voltage is necessary to obtain the desired shift of the head. In addition, the fact that the lead wires are connected near the free end, where the maximum shift of the bimorph element is obtainable, results in inferior connection, breakage, or the like, of the lead wires through usage over the years. Furthermore, the fear exists that when the head is vibrated, the resonance frequency of the bimorph element would lower due to the damping effect of the lead wires and the available frequency range would narrow.

It goes without saying that such inconvenience arises not only where the object to be moved is a magnetic head but also generally where an electrical lead wire is connected to an electrical member provided near the free end of an electrical-mechanical transducing element support at another end.

SUMMARY OF THE INVENTION

It is, accordingly, an object of the present invention to provide an electro-mechanical transducing element, and a moving device in which the element is used, free from the above inconvenience and, particularly, suitable for shifting an electrical member or members.

It is another object of the present invention to provide a novel electro-mechanical transducing element, on whose one or more parts an electrical member or members are provided to be mechanically shifted, and a moving device in which the element is used, capable of performing the proper shift operation essentially free from the influence of the connecting lead wires for the electrical member or members.

It is a further object of the present invention to provide an electro-mechanical transducing element, and a moving device in which the element is used, capable of preventing inferior connection, breakage, or the like, of the lead wires for the electrical member or members even after long term use.

It is still a further object of the present invention to provide the construction of a novel element for attaining the above objects without having any undesirable influence on the property and efficiency of the electro-mechanical transducing element itself.

It is a still further object of the present invention to provide economical and simple means for attaining the above objects.

To achieve these objects, according to a preferred embodiment of the present invention, an electro-mechanical transducing element having an elongated shape which is mechanically deformable in response to a supplied electrical signal, has one or more electrically conductive portions formed thereon to run along the elongation as one or more electrical paths for one or more electrical members affixed to a portion or portions near the free end of the elongation of the element to permit mechanical movements of the electrical members by utilizing the mechanical deformation of the element.

The further objects and features of the present invention will be apparent from the following description of preferred embodiments with reference to the accompanying drawings.

BRIEF DESCRIPTION OF THE DRAWINGS

Hereinafter, preferred embodiments of the present invention will be described in accordance with the accompanying drawings, in which.

DETAILED DESCRIPTION OF THE PREFERRED EMBODIMENTS

Figure 1:
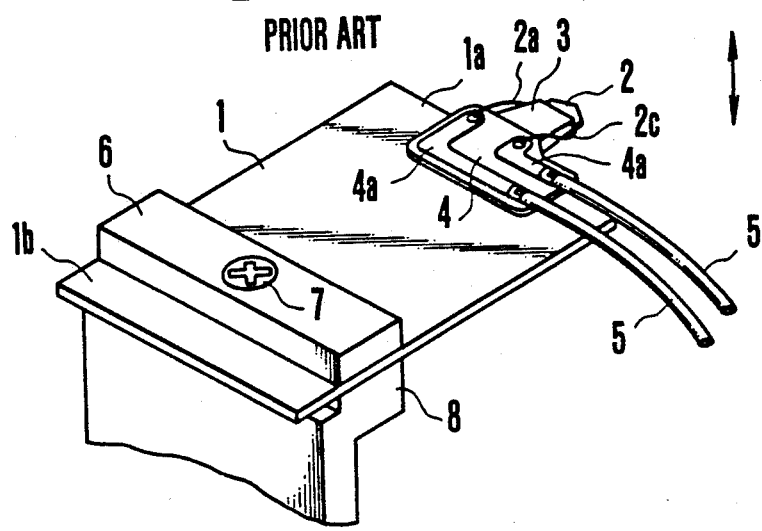
FIG. 1 is a perspective view showing an example of a conventional magnetic head moving device in which an electro-mechanical transducing element is used.

Prior to the description of the embodiments of the present invention, an example of a conventional magnetic head moving device will be described with reference to FIG. 1 wherein a piezoelectric bimorph element is used as an electro-mechanical transducing element.

In the drawing, 2 is a magnetic head, 3 is a head base, 4 is a printed circuit plate having conductive patterns 4a, 1 is a piezoelectric bimorph element constituting an electro-mechanical transducing element for shifting the magnetic head 2 upward or downward to adjust the position of the head 2, 6 is a press member for pressing the bimorph element 1 against a head carriage 8, and 7 is a screw for securing them.

The bimorph element 1 is secured at end 1b on a part of the head carriage 8 by the press member 6 and the screw 7, while the printed circuit plate 4 is secured at a free end 1a of the bimorph element 1. Further, the magnetic head 2 is positioned at the end of the head base 3, while the head base 3 is secured on a part of the printed circuit plate 4. Lead portions 2a of the coil of magnetic head 2 are connected to one end of the conductive patterns 4a on the printed circuit plate 4 by soldering or the like, so that the lead portions 2a are electrically connected via the patterns 4a to electrical lead wires 5 connected to the other end of the conductive patterns 4a by soldering or the like.

Figure 2B:
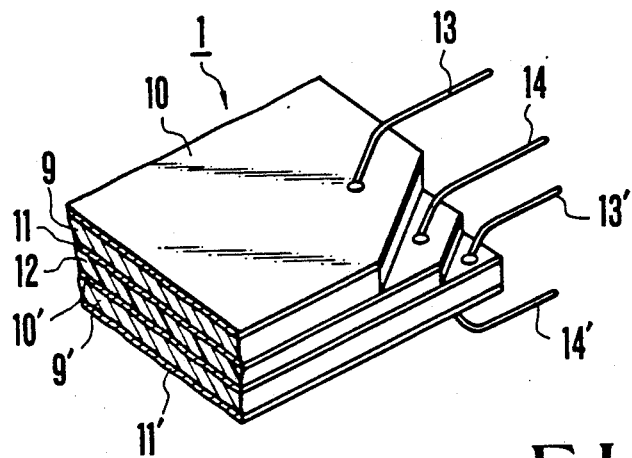
FIGS. 2A and 2B are fragmentary sectional views showing an example of the construction of a piezoelectric bimorph element.
Figure 2A:
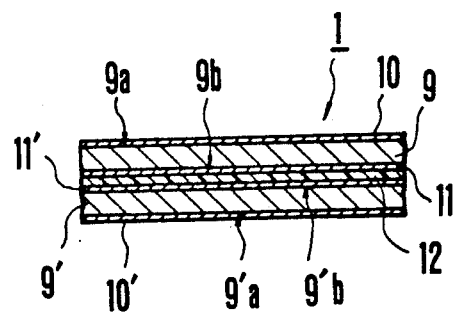

FIGS. 2A and 2B show an example of the sectional construction of the bimorph element 1 shown in FIG. 1. A piezoelectric ceramic plate 9, having electrodes 10 and 11 fixed respectively to both principal planes 9a and 9b of plate is laminated on a piezoelectric ceramic plate 9', having electrodes 10' and 11' fixed respectively to both principal planes 9'a and 9'b of plate 9', via an insulated intermediary plate (or adhesive layer) 12. The ceramic plates 9 and 9' are laminated in such a manner that their respective directions of polarization coincide with each other, that is, are in parallel.

As shown in FIG. 2B, lead wires 13, 14, 13' and 14' are connected to the electrodes 10, 11, 10' and 11', respectively by soldering or the like. A voltage is supplied to the ceramic plates 9 and 9' through these lead wires.

Given the above construction, when predetermined deflection voltages are applied to these electrodes in such a manner that the electrodes 10 and 10' and the electrodes 11 and 11' have the same polarities respectively, one of the piezoelectric ceramic plates 9 and 9' elongates, while the other shrinks. Deformation takes place because they are bonded to the intermediary plate 12, so that the head 2 provided at the free end 1a of the bimorph element 1 is shifted upward or downward as shown by the arrow in FIG. 1.

Figure 3:
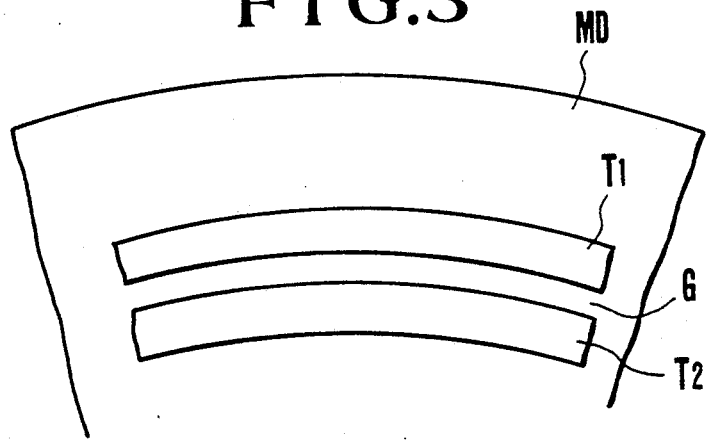
FIG. 3 is a fragmentary schematic illustration showing the aspect of a recording track on a magnetic disc.

FIG. 3 shows the aspect of a recording track, for example, on a magnetic disc, in which MD is the magnetic disc, T1 and T2 are the recording tracks and G is a guard band between the recording tracks T1 and T2. Now, assume that information for first and second television fields are recorded on tracks T1 and T2 respectively and both tracks hold one frame of information for television. When the information is reproduced by the head 2 under the NTSC television system, it is necessary for the head 2 to alternately trace the tracks T1 and T2 every 1/60 second on the magnetic disc MD rotating at 3600 r.p.m. Thus, for example, when the head 2 travels between the tracks for 15 H (1 H represents one horizontal period for television) and ringing is to be avoided, it is necessary to set the resonance frequency of the movable part of the head moving mechanism above 1 KHz. Assume now that the length of the effective deflection of the bimorph element 1 is 12 mm, the width 15 mm, the thickness 0.52 mm and the weight of the head 0.12 g. Calculation proves that the resonance frequency f0 is about 1 KHz and the obtained shift is satisfactory. However, in fact, the resonance frequency f0 lowers due to friction between the head 2 and the magnetic disc MD and the damping effect of the lead wires 5 connected to the printed circuit plate 4, so that the theoretical condition cannot be satisfied.

Furthermore, where, for example, aligning of the magnetic head 2 with the track to be read out on the magnetic tape or the magnetic disc is carried out automatically (which is possible, as is well known, for example, by controlling the driving of the bimorph element 1 to shift the head 2 in the direction along which the detected envelope level of the reproduced signal from the head 2 becomes higher), the fact that the lead wires 5 are connected to a portion near the free end 1a of the bimorph element 1, where the maximum shift is obtainable, causes an increase of the load on the bimorph element 1 because the lead wires 5 themselves have a certain rigidity. It is thus apparent that position control of the head 2 by the bimorph element 1 is influenced badly. As a result, a desire shift of the head 2 cannot be obtained or a larger drive voltage is necessary to obtain the desired shift of the head 2. In addition, the fact that the lead wires 5 are connected to a portion near the free end 1a, where the maximum shift of the bimorph element 1 is obtainable, causes an inferior connection, breakage, or the like through usage over the years.

According to the present invention, the above-mentioned inconveniences can be avoided, which will be described in accordance with the embodiments.

Figure 4:
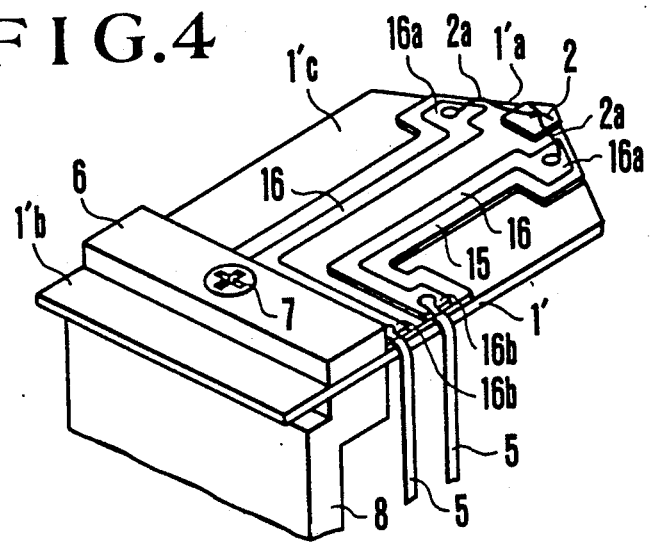
FIG. 4 is a perspective view showing an embodiment of the present invention applied to a magnetic head moving device.

FIG. 4 shows an embodiment of the present invention applied to the magnetic head moving device shown in FIG. 1. Members having the same reference numerals as those in FIG. 1 are the same members. In this embodiment, a flexible print film 15 on which conductive patterns 16 are printed is attached to one principal plane 1'c of a bimorph element 1' whose one end 1'b is secured on the head carriage 8. The conductive patterns 16 are shaped in such a manner that both ends 16a and 16b are positioned, respectively, near the free end 1'a and the fixed end 1'b of the bimorph element 1' having an elongated shape, that is, the patterns 16 run along the elongation of the bimorph element 1'. The lead portions 2a of the coil of the head 2 and the lead wires 5 are connected, respectively, by soldering or the like, to the ends 16a of the conductive patterns 16 at the free end 1'a of the bimorph element 1' and the ends 16b at the fixed end 1'b of the bimorph element 1'. The head 2 is secured near the free end 1'a of the bimorph element 1' via an insulation layer.

According to this construction, the influence by the lead wires 5 is almost eliminated. As a result, the desired proper shift of the bimorph element 1' and, consequently, the head 2, can be obtained, while inferior connection, breakage or the like of the lead wires 5 is avoided.

Figure 5:
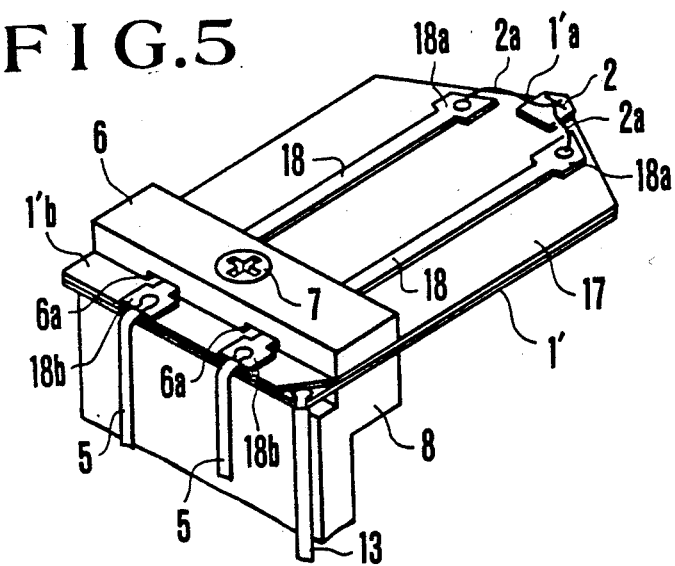
FIG. 5 is a perspective view showing another embodiment of the present invention applied to a magnetic head moving device.

FIG. 5 shows another embodiment of the present invention applied to the magnetic head moving device shown in FIG. 1. Members having the same reference numerals as those in FIG. 1 and FIG. 4 are the same members. In this embodiment, an insulation layer 17 is formed on one principal plane of the bimorph element 1', and conductive patterns 18 are formed on the insulation layer 17 by etching or the like to elongate or run from the fixed end 1'b to the free end 1'a of the bimorph element 1' having an elongated shape. Elements 6a are notches formed on the press member for the conductive patterns 18. Element 13 is one lead wire of the bimorph element 1', as shown in FIG. 2B. The lead portions 2a of the head 2 and the lead wires 5 shown in FIG. 5 are connected, respectively, by soldering or the like, to the ends 18a of the conductive patterns 18 at the free end 1'a of the bimorph element 1' and the ends 18b of the conductive patterns 18 prolonged to the back side of the press member 6. The head 2 is secured on the insulation layer 17 near the free end 1'a of the bimorph element 1'.

According to this construction, compared with the embodiment of FIG. 4, the lead wires 5 are connected to the end 1'b beyond the fixed portion of the bimorph element 1', that is, at a position where substantially no shift takes place at all. As a result, the influence of the lead wires 5 as well as the inconvenience due to inferior connection, breakage or the like is avoided without fail.

Figure 6:
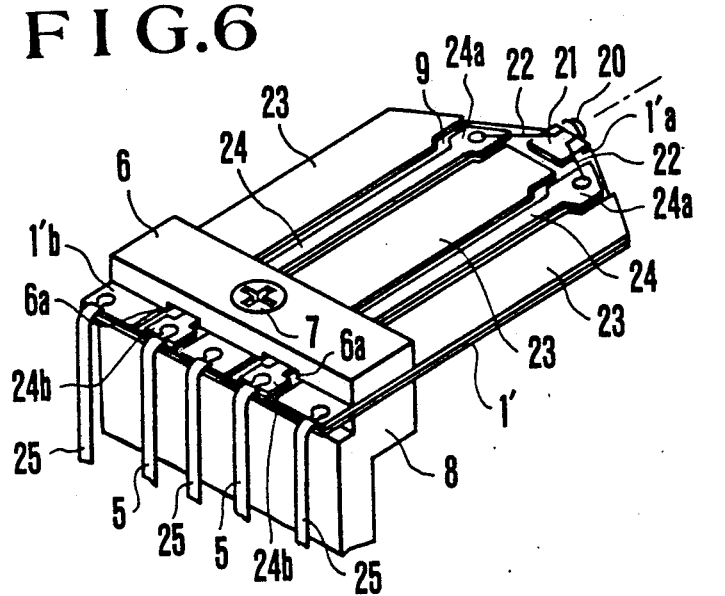
FIG. 6 is a perspective view showing another embodiment of the present invention applied to a beam scanning head moving device.

FIG. 6 shows a further embodiment of the present invention applied to a beam scanning head moving device. Members having the same reference numerals as those in FIGS. 1, 4 and 5 are the same members.

In FIG. 6, 20 is a light emitting element for emitting a scanning beam, which is secured on a base member 21 provided on the free end 1'a of the bimorph element 1'. The bimorph element 1', in this embodiment, has electrode portions 23 constituting three separate rows on the principal plane (9a in FIGS. 2A and 2B) at the upper side of the one piezoelectric ceramic plate 9, instead of the single electrode 10 shown in FIGS. 2A and 2B. Between the rows of the electrode portions 23 conductive portions 24 are provided in two rows. The conductive portions 24 as well as the electrode portions 23 are arranged to run from the fixed end 1'b to the free end 1'a of the bimorph element 1'. Lead portions 22 of the light emitting element 20 and lead wires 5 are connected respectively, by soldering or the like to the ends 24a of the conductive portions 24 at the free end 1'a of the bimorph element 1' and the ends 24b of the conductive portions 24 prolonged to the back side of the press member 6. Elements 25 are lead wires connected to the electrode portions 23 corresponding to lead wire 13 in FIG. 2B. Electrode portions 23 and conductive portions 24 can be shaped by properly removing parts of the conductive layer formed on the principal plane 9a of the piezoelectric ceramic plate 9.

In this construction, a beam from the light emitting element 20 is shifted upward or downward by the repeated shift of the bimorph element 1' to enable beam scanning, whereby the same results as in the case of the previous embodiments is obtained.

In the embodiments described above, the present invention is applied to a bimorph type electro-mechanical transducing element and a head moving device in which the element is used. However, it goes without saying that the present invention is not limited to such constructions. For example, as stated at the beginning, a piezoelectric ceramic plate and a substrate of metal are combined into a transducing element. Instead of the previously-described deformation, a straight movement can be obtained by shrinkage of a piezoelectric ceramic plate. Further, the shape of the piezoelectric ceramic plate is not limited to rectangular and can be circular or otherwise according to the intended purpose. In this case, a similar effect can be expected. For example, a semi-circular electro-mechanical transducing element is suited to a rotary head moving mechanism for a rotary head video tape recorder. The semi-circular element is secured on a rotary cylinder at both ends in the circumferential direction, while the magnetic head is secured at the middle portion between both ends. In this case, it is possible to provide conductive patterns to be connected to the lead wires of the head coil along the circle of the semi-circular element.

Further, the electrical member is not limited to a magnetic head or light emitting element as in the described embodiments. A light sensing element, etc., can be the electrical member according to the intended purpose. For example, the embodiment of FIG. 6, or an opto-electric element moving mechanism, in which the light emitting element 20 is replaced by a light sensing element, is suited to a recording or reproducing head of an optical disc device.

Further, the number of electrical members provided on one electro-mechanical transducing element is not limited to one but can be a multiplicity of members. Further, it goes without saying that the number of conductive patterns for the electrical members to be provided on the transducing element can be one, or not less than three, according to the requirement of the electrical members.

As has been described in detail, according to the present invention, the influence of the connecting lead wires for an electrical member or members can be essentially eliminated, while an inferior connection for the connecting lead wires can be avoided, so that the electro-mechanical transducing element and the moving device in which the element is used, on whose one or more parts the electrical member or members to be mechanically moved are provided, are quite convenient.

What we claim:

1. In an electro-mechanical transducing element for moving at least one electrical device in response to a supplied electrical signal, said element being generally elongated in shape with a first free and movable portion to which said electrical device is attached, and a second relatively fixed portion affixed to a relatively fixed supporting device, said element having an elongated surface extending between said first and second portions, the improvement comprising:

at least one elongated electrically conductive portion adapted to be electrically connected to said electrical device, said electrically conductive portion being arranged between said first and second portions and extending lengthwise along the elongated element, said electrically conductive portion including an insulating flexible printed circuit plate cemented substantially continuously along and to the surface between said first portion and a position near said second portion of said electro-mechanical transducing element, and extending from said first portion to a position near said second portion, and said electrically conductive portion being formed as a conductive pattern printed on said printed circuit plate.

2. An electro-mechanical transducing element for use with at least one electrical device, comprising:
(A) at least one piezo-ceramic plate of a generally elongated shape having a pair of planar surfaces, said piezo-ceramic plate having a fixed portion and a movable portion;
(B) at least one electrode affixed to one of said surfaces of said piezo-ceramic plate; and
(C) at least one electrical conductor for forming an electrical path for said electrical device, said conductor being flexible and formed on said piezo-ceramic plate and extending lengthwise along the elongated ceramic plate while being insulated from said electrode, said conductor being fixed continuously along and printed on the surface of a zone ranging continuously from said fixed portion to the movable portion of said piezo-ceramic plate along the direction from the fixed portion to the movable portion in an insulated state with respect to said electrode.

3. A piezoelectric bimorph element for use with an electrical device, comprising:
(A) a pair of electrically paired piezo-ceramic plates bonded to a common substrate between the plates, the bonded pair of ceramic plates having a first portion adapted to be affixed to a supporting device and a second portion which is free to deflect to move said electrical device;
(B) a plurality of electrodes for applying to each of said piezo-ceramic plates a deflection voltage; and
(C) a pair of flexible electrical conductors for forming a pair of electrical paths for said electrical device, each of said conductors being stuck continuously along and to said bonded pair of piezo-ceramic plates between said first portion and said second portion while being insulated from said electrodes and extending from said second portion toward said first portion of the bonded plates.

4. The element according to claim 3, wherein said pair of conductors is disposed on one of said electrodes and has an insulation layer therebetween.

5. The element according to claim 3, wherein said pair of conductors is disposed on one of said piezo-ceramic plates together with one of said electrodes.

6. An assembly comprising:
(A) at least one electrical device;
(B) an electro-mechanical transducing element for moving said electrical device in response to a supplied electrical signal, said element having a first portion and a second freely-movable portion, said electrical device being affixed to said second portion, and said element further having a first electrically conductive portion extending from said second portion toward said first portion and electrically connected to said electrical device, and a second electrically conductive portion extending from said second portion toward said first portion and electrically connected to said electro-mechanical transducing element and insulated from said first electrically conductive portion, said second electrically conductive portion being formed integrally with said transducing element, said first and second electrically conductive portions being integrally attached to a continous portion between said first and second portions of said electro-mechanical transducing element; and
(C) means for supporting said transducing element at said first portion thereof.

7. The assembly according to claim 6, wherein said electrical device includes a magnetic transducer head.

8. The assembly according to claim 6, wherein said electrical device includes a light emitting element.

9. The assembly according to claim 6, wherein said electrical device includes a light receiving element.

10. An assembly comprising:
(A) at least one electrical device;
(B) an electro-mechanical transducing element for moving said electrical device in response to a supplied electrical signal, said element having a first portion and a second freely-movable portion, said electrical device being affixed to said second portion, and said element including:
(B-1) at least one piezo-ceramic plate;
(B-2) at least one electrode affixed to said piezo-ceramic plate; and
(B-3) at least one flexible electrical conductor electrically connected to said electrical device and forming an electrical path for said electrical device, said conductor being stuck to said pizeo-ceramic plate and continuously between said second portion and said first portion of the element while being insulated from said electrode; and
(C) means for supporting said transducing element at said first portion thereof.

11. The assembly according to claim 10, wherein said electrical device includes a magnetic transducer head.

12. The assembly according to claim 10, wherein said electrical device includes a light emitting element.

13. The assembly according to claim 10, wherein said electrical device includes a light receiving element.

14. An assembly comprising:
(A) at least one electrical device;
(B) a piezoelectric bimorph element for moving said electrical device, said element having a first portion and a second portion free to deflect, said electrical device being affixed to said second portion, and said element including:
(B-1) a pair of electrically paired piezo-ceramic plates bonded to a common substrate between the plates;
(B-2) a plurality of electrodes for applying to each of said piezo-ceramic plates a deflection voltage, said electrodes extending from said first portion to said second portion, and having a portion thereof cemented to one of said piezo-ceramic plates; and
(B-3) a pair of electrical conductors electrically connected to said electrical device and forming a pair of electrical paths for said electrical device, each of said conductors being stuck to said bonded pair of piezo-ceramic plates at positions removed from said electrodes while being insulated from said electrodes continuously between said second portion and said first portion of the bonded plates; and (C) means for supporting said bimorph element at said first portion.

15. The assembly according to claim 14, wherein said pair of conductors in said bimorph element is disposed on one of said electrodes and has an insulation layer therebetween.

16. The assembly according to claim 14, wherein said pair of conductors in said bimorph element is disposed on one of said piezo-ceramic plates together with one of said electrodes.

17. The assembly according to claim 14, wherein said electrical device includes a magnetic transducer head.

18. The assembly according to claim 14, wherein said electrical device includes a light emitting element.

19. The assembly according to claim 14, wherein said electrical device includes a light receiving element.

20. A piezo-electric element comprising:

(a) a flexible piezo-electric plate of elongated shape;

(b) an electrical device provided at a first end of said piezo-electric plate;

(c) a first flexible electrode attached continuously along the length of said piezo-electric plate and electrically connected thereof; and (d) a second flexible electrode attached along the length of said piezo-electric plate and electrically insulated therefrom, said second flexible electrode being electronicaly connected to said electrical device, said second flexible electrode being attached continuously up to a portion near an end portion of said flexible piezo-electric plate on the opposing side of said electrical device.

* * * * *